(12) United States Patent
Maida (10) Patent No.: US 7,285,992 B1
(45) Date of Patent: Oct. 23, 2007

(54) AMPLIFIER WITH CHARGE-PUMP GENERATED LOCAL SUPPLIES

(75) Inventor: Michael X. Maida, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/327,709

(22) Filed: Dec. 20, 2002

(51) Int. Cl.
*H03B 1/00* (2006.01)
*H03K 3/00* (2006.01)

(52) U.S. Cl. ...................................... 327/112; 330/253

(58) Field of Classification Search ................ 327/319, 327/333, 68, 75, 108, 112; 326/62, 63, 81; 330/253
See application file for complete search history.

(56) References Cited

U.S. PATENT DOCUMENTS

| | | | | |
|---|---|---|---|---|
| 4,064,506 A | * | 12/1977 | Cartwright, Jr. | ............ 341/135 |
| 4,807,104 A | * | 2/1989 | Floyd et al. | ................... 363/59 |
| 5,880,638 A | * | 3/1999 | Schaffer | ..................... 330/255 |
| 5,898,342 A | | 4/1999 | Bell | ........................... 330/297 |
| 5,952,847 A | * | 9/1999 | Plants et al. | ................... 326/80 |
| 6,226,356 B1 | | 5/2001 | Brown | ......................... 379/24 |
| 6,236,234 B1 | * | 5/2001 | Yagi | ............................. 326/80 |
| 6,240,027 B1 | * | 5/2001 | Lee et al. | .............. 365/189.11 |
| 6,323,686 B1 | | 11/2001 | Bisson et al. | ................... 326/82 |
| 6,429,683 B1 | * | 8/2002 | Miller et al. | ................... 326/80 |
| 6,498,527 B2 | * | 12/2002 | Matsumoto | ................. 327/536 |
| 6,504,418 B1 | * | 1/2003 | Coughlin, Jr. | ............. 327/319 |
| 6,583,646 B1 | * | 6/2003 | Patel et al. | .................... 326/80 |

* cited by examiner

*Primary Examiner*—Quan Tra
(74) *Attorney, Agent, or Firm*—Brett A. Hertzberg; Merchant & Gould PC (57) ABSTRACT

An amplifier system includes a follower-type output stage that is driven by a pre-driver circuit. The follower-type output stage that is operated from VCC and GND (or VEE) power supplies. The pre-driver circuit for the follower output stage is operated from local power supplies corresponding to VHI and VLO. A charge-pump circuit generates the VHI power-supply such that VHI is above VCC. Another charge-pump circuit generates the VLO power-supply such that VLO is below GND (or VEE). The output stage delivers current to a load from the VCC and GND (or VEE) power supplies such that the output stage has increased power efficiency.

21 Claims, 7 Drawing Sheets

AMPLIFIER WITH CHARGE-PUMP GENERATED LOCAL SUPPLIES

FIELD OF THE INVENTION

The present invention is generally related to amplifiers that include follower-type output stages. More particularly, the present invention relates to generating increased local power-supply rails via a charge-pump circuit such that a pre-driver circuit has increased drive range for a follower-type output stage in an amplifier.

BACKGROUND OF THE INVENTION

Computer systems are often connected to a communication network via telephone lines. A popular means for connecting computer systems to a network is over a digital subscribed line (DSL). DSLs come in many varieties including asymmetric (ADSL), symmetric (SDSL), rate-adaptive (RADSL), and very high bit-rate (VDSL).

The DSL shares the same physical wire as a common telephone line. The telephone wire is a twisted pair of copper wires, which has a maximum signal bandwidth from 300 kHz-10 MHz., depending on the length of the line. Since a typical voice communication requires only a portion of the total bandwidth (e.g., around 4 kHz) available on the telephone line, the additional unused bandwidth is available on the line for the DSL communication without interfering with telephone communication.

A subscriber device such as a computer communicates with a service provider via a DSL modem. The DSL modem is physically connected between the subscriber device and the telephone wire, and includes a DSL line driver. The DSL line driver includes a power amplifier that delivers a signal to the telephone line.

SUMMARY OF THE INVENTION

Briefly stated, the present invention is related to an amplifier system includes a follower-type output stage that is driven by a pre-driver circuit. The follower-type output stage that is operated from VCC and GND (or VEE) power supplies. The pre-driver circuit for the follower output stage is operated from local power supplies corresponding to VHI and VLO. A charge-pump circuit generates the VHI power-supply such that VHI is above VCC. Another charge-pump circuit generates the VLO power-supply such that VLO is below GND (or VEE). The output stage delivers current to a load from the VCC and GND (or VEE) power supplies such that the output stage has increased power efficiency. The output stage may be implemented in any technology such as FET transistors and/or BJT transistors.

A more complete appreciation of the present invention and its improvements can be obtained by reference to the accompanying drawings, which are briefly summarized below, the following detail description of presently preferred embodiments of the invention, and the appended claims.

DETAILED DESCRIPTION OF THE PREFERRED EMBODIMENT

Throughout the specification, and in the claims, the term "connected" means a direct electrical connection between the things that are connected, without any intermediate devices. The term "coupled" means either a direct electrical connection between the things that are connected, or an indirect connection through one or more passive or active intermediary devices. The term "circuit" means either a single component or a multiplicity of components, either active or passive, that are coupled together to provide a desired function.

The present invention is related to a driver amplifier for a DSL. The driver amplifier includes two charge-pumps that are arranged to provide local power supplies. The local power supplies are used in a level shifting circuitry that is coupled to the output stage. The resulting driver amplifier has a signal swing that is within a VCE(SAT) of the power-supply rails (or VDS(SAT)), has reduced quiescent current, and low distortion.

In one example, the output stage of the driver amplifier is connected between 12V and ground. For this example, the charge-pumps are arranged to provide local power supplies that are at +15V and −3.3V such that near rail-to-rail output levels are achieved with low overheard loss. The first charge-pump transfers charge from a 3.3V supply to generate the +15V supply, while the second charge-pump transfers charge from the 3.3V supply to generate the −3V supply. The charge-pump circuitry can be implemented in an integrated circuit such as a 3V CMOS process.

Although many of the examples that follow below are described as operating from a ground power supply rail (GND), another low power supply rails may be employed. For example, a VEE power supply may be used in place of the GND power supply for the output stage. Also, another power supply other than 3.3V may be employed for the charge-pump. For example, a VDD power supply may be used for the charge-pump with an operating voltage of 2.5V, 3.3V, or 5V. The VDD power supply voltage is selected based on the limits on the semiconductor process for the driver amplifier, and the design of the pre-driver circuit.

Operating Environment

Figure 1:
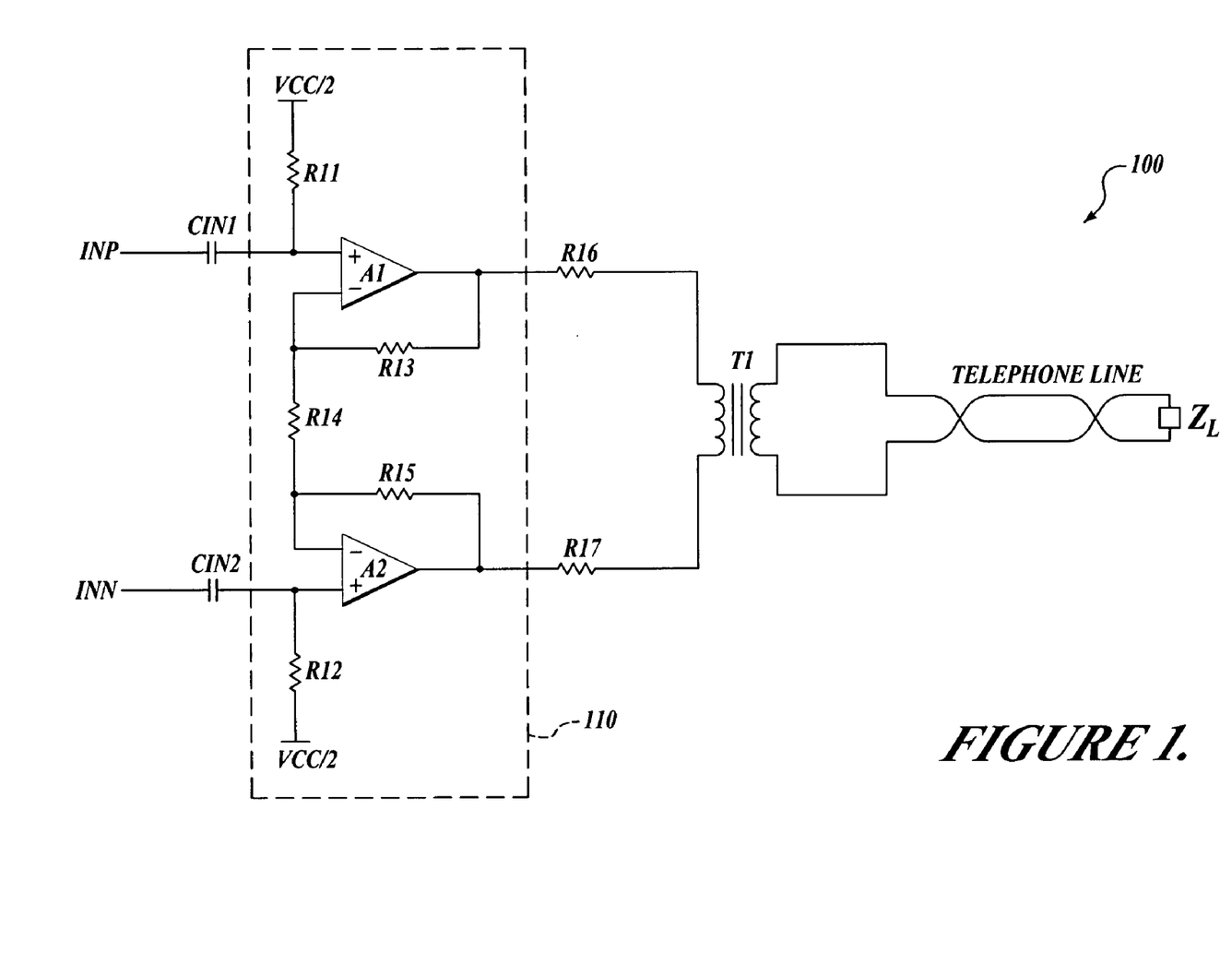
FIG. 1 is a schematic diagram of a system application of the driver amplifier that is configured in accordance with the present invention.

FIG. 1 is a schematic diagram (100) of a system application of the driver amplifier that is configured in accordance with the present invention. The system includes two input coupling capacitors (CIN1, CIN2), a DSL driver system (110), two terminating resistors (R16, R17), a transformer (T1), a telephone line, and a load (ZL). DSL driver system 110 includes two biasing resistors (R11, R12), gain setting resistors (R13, R14, R15), and two driver amplifiers (A1, A2).

Capacitors CIN1 and CIN2 are arranged to couple an AC input signal (INP, INN) to the non-inverting input terminals of driver amplifiers A1 and A2. Resistors R11 and R12 are arranged to provide a DC bias voltage (VCC/2) to the non-inverting input terminals of driver amplifiers A1 and A2. Amplifiers A1 and A2 are arranged in a bridged amplifier configuration, where resistors R13 through R15 set the gain for the bridged amplifier. Although the system illustrated in FIG. 1 includes gain setting resistors R13-R15, resistors R13-R15 may be eliminated when the gain is internally set in the amplifiers (A1, A2).

Resistors R16 and R17 couple the output of the bridged amplifier to the primary coil of transformer T1, where the values associated with resistors R16 and R17 determine the termination impedance of the amplifiers. The secondary coil of the transformer is coupled to a twisted pair line such as a telephone line. The twisted pair line is terminated by a remote line termination, as represented by load ZL. In one example, the termination impedance (load ZL) corresponds to 100 ohms.

Driver Amplifier Overview

Figure 2:
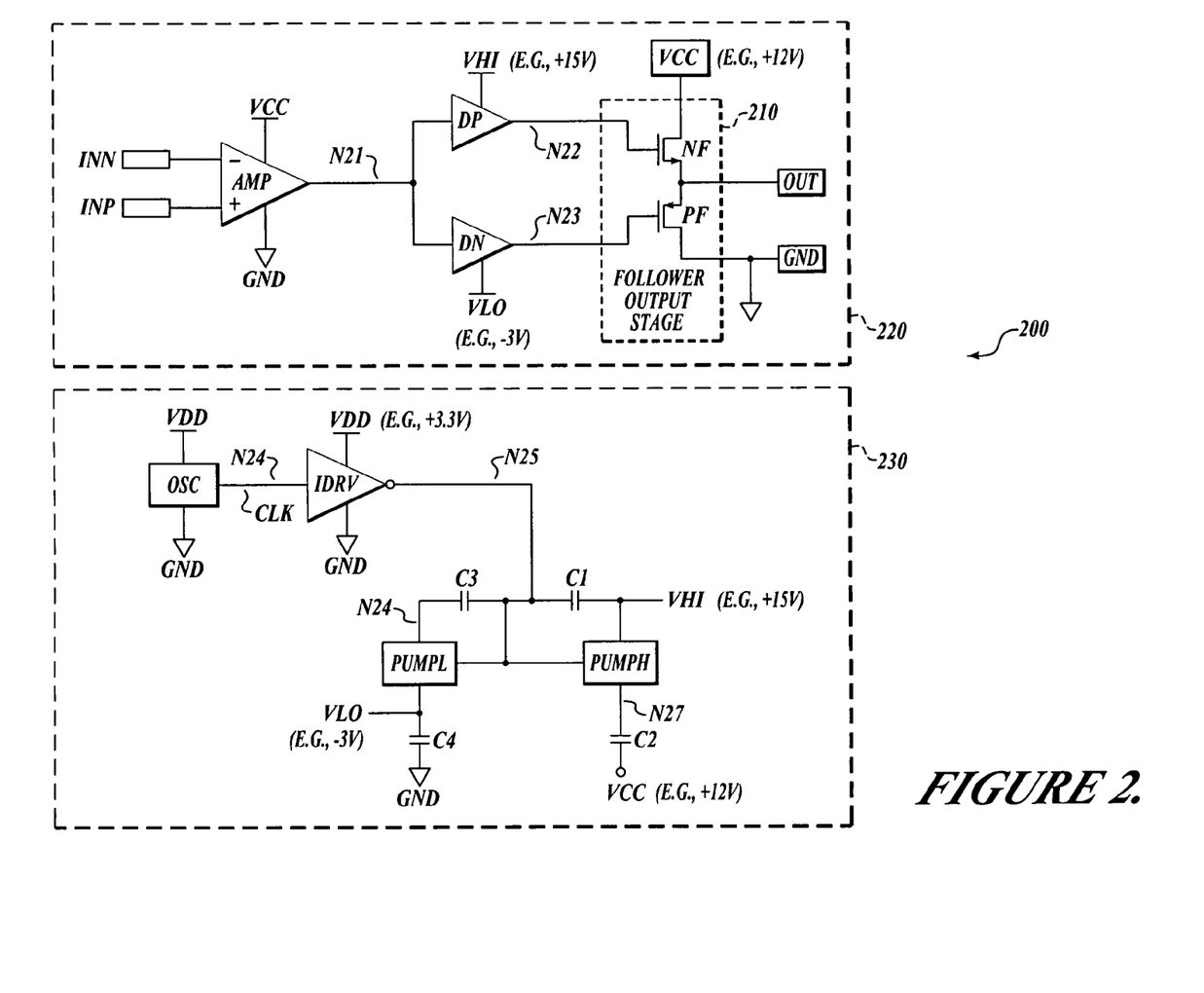
FIG. 2 is a schematic diagram of a driver amplifier system that is arranged in accordance with the present invention.

FIG. 2 is a schematic diagram (200) of a driver amplifier system that is arranged in accordance with the present invention. The driver amplifier system includes an amplifier portion (220) and a charge-pump portion (230). Amplifier portion 220 includes an amplifier (AMP), a high level-shift driver (DP), a low level-shift driver (DN), and a follower-type output stage (210). Charge-pump portion 230 includes an oscillator circuit (OSC), an inverting driver (IDRV), a high charge-pump circuit (PUMPH), a low charge-pump circuit (PUMPL), and four capacitors (C1-C4).

Amplifier AMP is configured to provide an intermediate signal to node N21 in response to a differential input signal that is applied to INN and INP. Driver DP is configured to provide a high drive signal to node N22 in response to the intermediate signal at node N21. Driver NP is configured to provide a low drive signal to node N23 in response to the intermediate signal at node N21. Follower-type output stage 210 is configured to provide an output signal between terminals OUT and GND in response to the high and low drive signals. In one example, follower-type output stage 210 includes an n-type field effect transistor (NFET) and a p-type field effect transistor (PFET) that are configured as a common source output stage that is responsive to the high and low drive signals. In another example, follower-type output stage 210 includes an n-type bipolar junction transistor (NPN BJT) and a p-type bipolar junction transistor (PNP BJT) that are configured as a common emitter output stage that is responsive to the high and low drive signals. Drivers DP and NP may be separate circuits or combined into a single pre-driver circuit.

Capacitor C1 is coupled between node N25 and VHI. Capacitor C2 is coupled between node N27 and VCC. Capacitor C3 is coupled between node N25 and node N26. Capacitor C4 is coupled between VLO and GND. PUMPL is coupled to node N25, N26 and VLO. PUMPH is coupled to node N25, N27 and VHI. Oscillator OSC is coupled to node N24. Inverting driver IDRV is coupled between node N24 and node N25.

In operation, oscillator OSC is configured to provide a clock signal (CLK) at node N24. Inverting driver IDRV is configured to provide a charging signal to node N25 in response to the clock signal (CLK). The charge-pump circuits are arranged to generate voltages for VHI and VLO in response to the charging signal at node N25. The charge-pump circuits will be described in further detail with respect to FIGS. 3A-3C.

Power-supply connections are shown at key points in FIG. 2. As shown, the amplifier (AMP) and the follower-type output stage (210) are operated from power-supply rails VCC and GND. However, the pre-driver circuit (driver circuits DP and DN are operated from VHI and VLO such that the drive signals at nodes N22 and N23 have maximum signal swing to provide near rail-to-rail performance in the output stage. Since oscillator circuit OSC and inverting driver circuit IDRV are operated from power-supply rails VDD and GND, an integrated circuit solution is possible. In one example, VDD is +3.3V, VCC is +12V, and VHI and VLO correspond to +15V and −3.0V, respectively.

Charge-Pump Overview

Figure 3A:
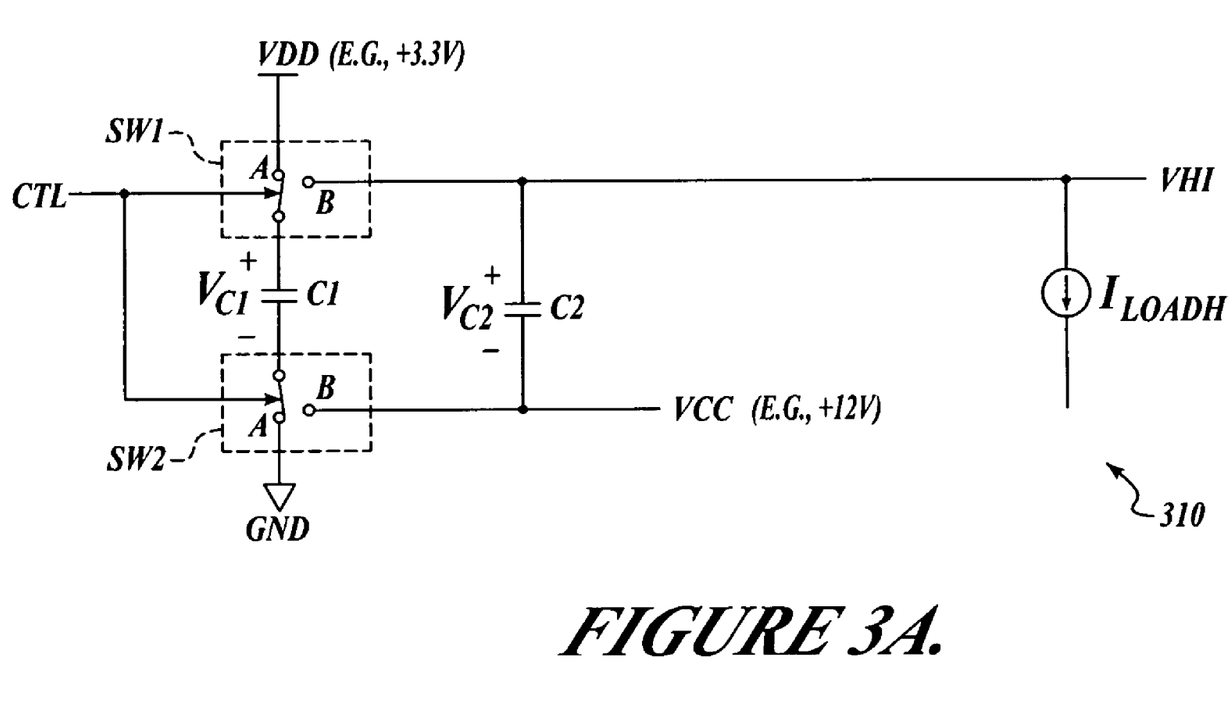
FIG. 3A is a schematic diagram that illustrates the operation of a high charge-pump circuit that is arranged in accordance with the present invention.

FIG. 3A is a schematic diagram (310) that illustrates the operation of a high charge-pump circuit that is arranged in accordance with the present invention. The high charge-pump circuit includes two capacitors (C1, C2), and two switching circuits (SW1, SW2).

Capacitor C1 is coupled between the common terminals on switching circuits SW1 and SW2. Capacitor C2 is coupled between VHI and VCC. Switching circuit SW1 is coupled to VDD at a first terminal, VHI at a second terminal, and CTL at a control terminal. Switching circuit SW2 is coupled to GND at a first terminal, VCC at a second terminal, and CTL at a control terminal.

Figure 3B:
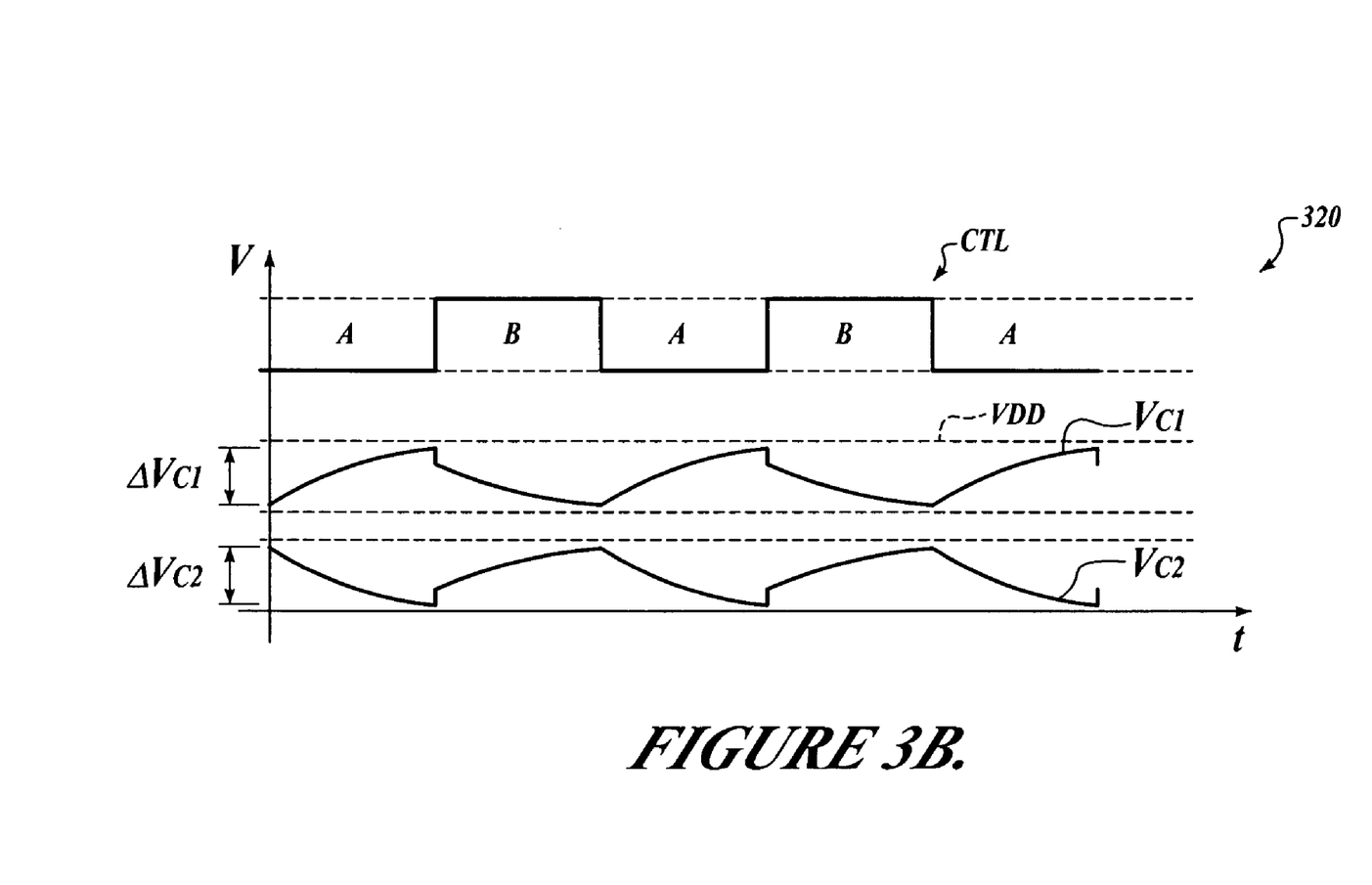
FIG. 3B is a timing diagram that illustrates the operation of a high charge-pump circuit that is arranged in accordance with the present invention.

The operation of the high charge-pump circuit is described with respect to the timing diagram (320) that is illustrated in FIG. 3B. As shown in the figure, control signal CTL cycles between a state where switching circuits SW1 and SW2 are in the first position (A), and a state where switching circuits SW1 and SW2 are in a second position (B). The first position (A) corresponds to a charging phase, while the second position (B) corresponds to a charge-redistribution phase.

In operation, capacitor C1 stores a voltage (VC1) corresponding to VDD-GND when switching circuits SW1 and SW2 are in the first position (A). Thus, capacitor C1 charges up to VDD such that a charge is stored on capacitor C1 that corresponds to VDD*C1. Capacitor C1 and C2 are coupled together in parallel between VHI and VCC while switching circuits SW1 and SW2 are in the second position (J3). Charge is redistributed between capacitors C1 and C2 such that the final voltage on capacitor C1 and C2 are the same. Since C2 is referenced to VCC, the voltage on the top plate of capacitor C2 will increase above VCC by an amount that is determined according to the charge redistribution between C1 and C2. Assuming that capacitor C2 initially has no charge stored therein, the voltage associated with capacitor C2 is given by: VHI=VDD/(1+[C2/C1])+VCC. When C2 has a capacitance value that is much less than C1, VHI=VDD+VCC. After capacitor C2 has some stored some charge, VHI−{VDD/(1+[C2/C1])}+{VC2/(1+[C1/C2])}.

In a non-ideal condition, a load (not shown) draws a high load current (ILOADH) from VHI as shown by the changes in VC2. Also, their may be an appreciable non-ideal resistance associated with switching circuits SW1 and SW2 that results in an RC time-constant that is associated with the charging of capacitor C1, and the charge transfer associated with C2 (see VC1, VC2 in FIG. 3B). Furthermore, the switching circuits may have appreciable parasitic capacitances between the output and control terminals that will reduce the output voltage. However, the voltage associated with VHI is "refreshed" periodically in response to CTL such that the steady-state value of VHI will approach VCC+VDD.

Figure 3C:
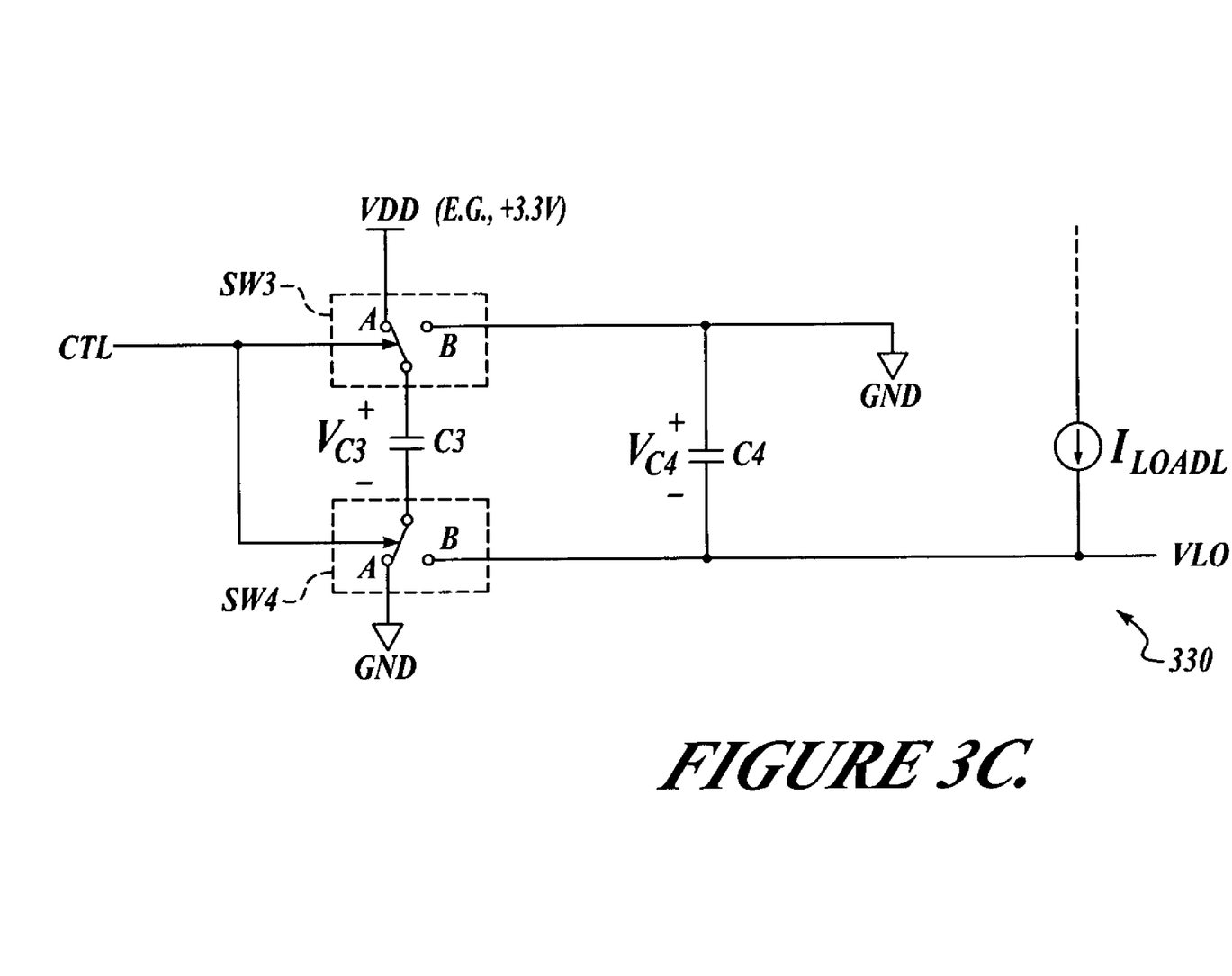
FIG. 3C is a schematic diagram that illustrates the operation of a low charge-pump circuit that is arranged in accordance with the present invention.

FIG. 3C is a schematic diagram (330) that illustrates the operation of a low charge-pump circuit that is arranged in accordance with the present invention. The low charge-pump circuit includes two capacitors (C3, C4), and two switching circuits (SW3, SW4).

Capacitor C3 is coupled between the common terminals on switching circuits SW3 and SW4. Capacitor C4 is coupled between GND and VLO. Switching circuit SW3 is coupled to VDD at a first terminal, GND at a second terminal, and CTL at a control terminal. Switching circuit SW4 is coupled to GND at a first terminal, VLO at a second terminal, and CTL at a control terminal.

The operation of the low charge-pump circuit is described with respect to the timing diagram (320) that is illustrated in FIG. 3B. As shown in the figure, control signal CTL cycles between a state where switching circuits SW3 and SW4 are in the first position (A), and a state where switching circuits SW3 and SW4 are in a second position (B).

In operation, capacitor C3 stores a voltage (VC3) corresponding to VDD−GND when switching circuits SW3 and SW4 are in the first position (A). Thus, capacitor C3 charges up to VDD such that a charge is stored on capacitor C3 that corresponds to VDD*C3. Capacitors C3 and C4 are coupled together in parallel between GND and VLO while switching circuits SW3 and SW4 are in the second position (B). Charge is redistributed between capacitors C3 and C4 such that the final voltage on capacitors C3 and C4 are the same. Since C4 is referenced below GND, the voltage on the bottom plate of capacitor C4 will decrease below GND by an amount that is determined according to the charge redistribution between capacitors C3 and C4. Assuming that capacitor C4 does not initially have any stored charge, the voltage associated with capacitor C4 is given by: VLO=GND−VDD/(1+[C4/C3]). When C4 has a capacitance value that is much less than C3, VLO=GND−VDD. After capacitor C4 has stored charge, VLO=GND−{VDD/(1+[C4/C3])}−{VC4/(1+[C3/C4])}.

In a non-ideal condition, a load current (ILOADL) causes VLO to gradually change over time. Also, their may be an appreciable non-ideal resistance associated with switching circuits SW3 and SW4 that results in an RC time-constant that is associated with the charging of capacitor C3 (see VC1 in FIG. 3B), and the charge transfer associated with C4. However, the voltage associated with VLO is "refreshed" periodically in response to CTL such that the stead-state value of VHI approaches VCC+VDD.

The voltages associated with the local power supply will be slightly reduced to non-ideal switching circuits and other parasitic elements in the circuit. For example, the non-ideal switching circuits include a non-zero "on" resistance when the switching circuits are operated in a closed-circuit state. Moreover, the switching circuits also include non-ideal capacitances that are lumped to critical nodes in the circuit (e.g., parasitic capacitances that are coupled to VHI and VLO). These parasitic capacitances and resistances result in reduction to VHI such as: VHI=VCC+VDD−delta V, where delta V is a small error that is related to switch resistance and parasitic capacitance. Similarly, VLO=VEE−VDD+delta V, where VDD is a power-supply voltage for the charge-pump circuit, and delta V is a small error that is related to switch resistance and parasitic capacitance.

Example Charge-Pump

Figure 4:
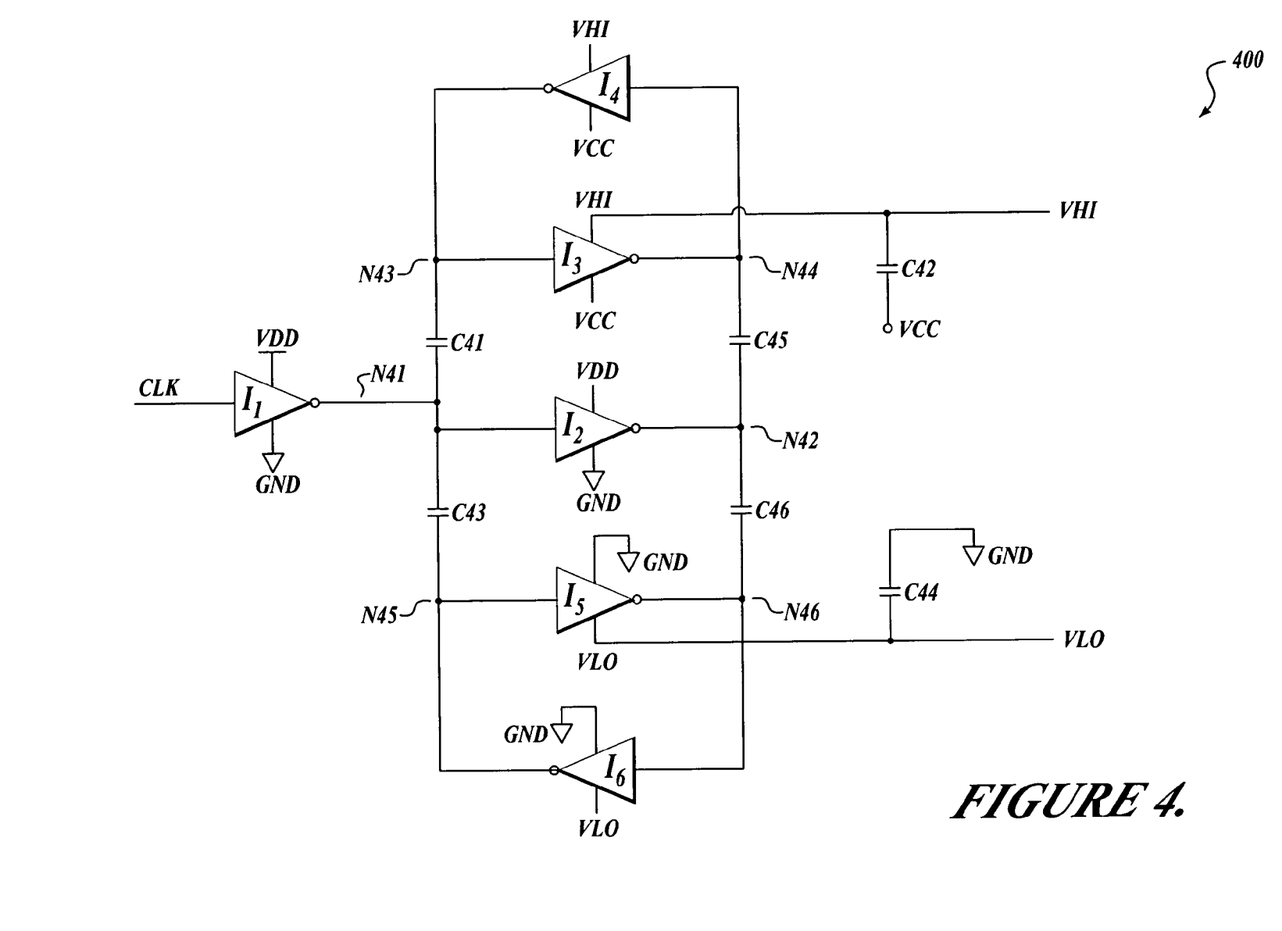
FIG. 4 is a schematic diagram that illustrates an example charge-pump circuit that includes facilities for high and low power-supply generation, in accordance with the present invention.

FIG. 4 is a schematic diagram that illustrates an example charge-pump circuit (400) that includes facilities for high and low power-supply generation. The charge-pump circuit (400) includes six capacitors (C41-C46), and six inverter circuits (I1-I6).

Inverter circuit I1 includes an input that is coupled to CLK, and an output that is coupled to node N41. Inverter circuit I2 includes an input that is coupled to node N41, and an output that is coupled to node N42. Inverter circuit I3 includes an input that is coupled to node N43, and an output that is coupled to node N44. Inverter circuit I4 includes an input that is coupled to node N44, and an output that is coupled to node N43. Inverter circuit I5 includes an input that is coupled to node N45, and an output that is coupled to node N45. Inverter circuit I6 includes an input that is coupled to node N46, and an output that is coupled to node N45. Capacitor C41 is coupled between node N43 and node N41. Capacitor C42 is coupled between VHI and VCC. Capacitor C43 is coupled between node N41 and node N45. Capacitor C43 is coupled between node N44 and node N42. Capacitor C44 is coupled between GND and VLO. Capacitor C45 is coupled between node N44 and node N42. Capacitor C46 is coupled between node N42 and node N46. Inverter circuits I1 and I2 are operated from power-supply rails VDD and GND. Inverter circuits I3 and I4 are operated from power-supply rails VHI and VCC. Inverter circuits I5 and I6 are operated from power-supply rails GND and VLO.

The inverter circuits are arranged to cooperate with the capacitors to generate the power-supply rails for VHI and VLO. Inverter circuits I2, I3, and I5 are strong inverting stages that have higher drive/gain capabilities than inverter circuits I1, I4, and I6. The stronger inverter circuits skew delay paths so that the capacitors are charged in a break before make operation.

Capacitor circuits C41 and C43 are arranged to provide isolation between the inverter circuits so that the DC levels for inverter I3/I4 and I5/I6 are shifted with respect to the DC levels for inverters I1/I2. Transient signals (e.g., a narrow pulse or spike) are transferred through capacitors C41 and C43 such that inverter circuits I3 and I5 change output states at each transition in the clock signal. Inverter circuit I4 provides a DC biasing for inverter circuit I3 so that the input range of inverter circuit I3 is bounded by VCC and VHI. Similarly, inverter circuit I6 provides a DC biasing for inverter circuit I5 so that the input range of inverter circuit I5 is bounded by VLO and GND. Inverter circuits I4 and I6 are also arranged to provide positive feedback to inverter circuits I3 and I5, respectively so that the operating conditions of those inverters track changes in the clock signal.

Capacitor C45 is a charge transfer capacitor that is configured to transfer charge for the high charge-pump circuit. For example, capacitor C45 includes a top plate that is coupled to VCC through inverter circuit I3, and a bottom plate that is coupled to GND through inverter circuit I2 when the clock signal transitions from high to low. This condition corresponds to the charging phase, where the output of inverter circuit I4 is maintained at VHI and capacitor C45 stores a voltage corresponding to VCC−GND. At the next transition in the clock signal (low to high), the bottom plate of capacitor C45 is coupled to VDD through inverter circuit I2 and the top plate of capacitor C45 is coupled to VHI through inverter circuit I3. This condition corresponds to a charge redistribution phase, where the charge stored on capacitor C45 is transferred to capacitor C42 such that VHI corresponds to VCC+VDD at steady-state.

Capacitor C46 is a charge transfer capacitor that is configured to store charge for the low charge-pump circuit. For example, capacitor C46 includes a top plate that is coupled to VDD through inverter circuit I2, and a bottom plate that is coupled to GND through inverter circuit I5 when the clock signal transitions from low to high. This condition corresponds to the charging phase, where the output of inverter circuit I6 is maintained at VLO and capacitor C46 stores a voltage corresponding to VDD−GND. At the next transition in the clock signal (high to low), the top plate of capacitor C46 is coupled to GND through inverter circuit I2 and the bottom plate of capacitor C46 is coupled to VLO through inverter circuit I5. This condition corresponds to a charge redistribution phase, where the charge stored on capacitor C46 is transferred to capacitor C44 such that VLO corresponds to GND−VDD at steady-state.

Example Amplifier Circuit

Figure 5:
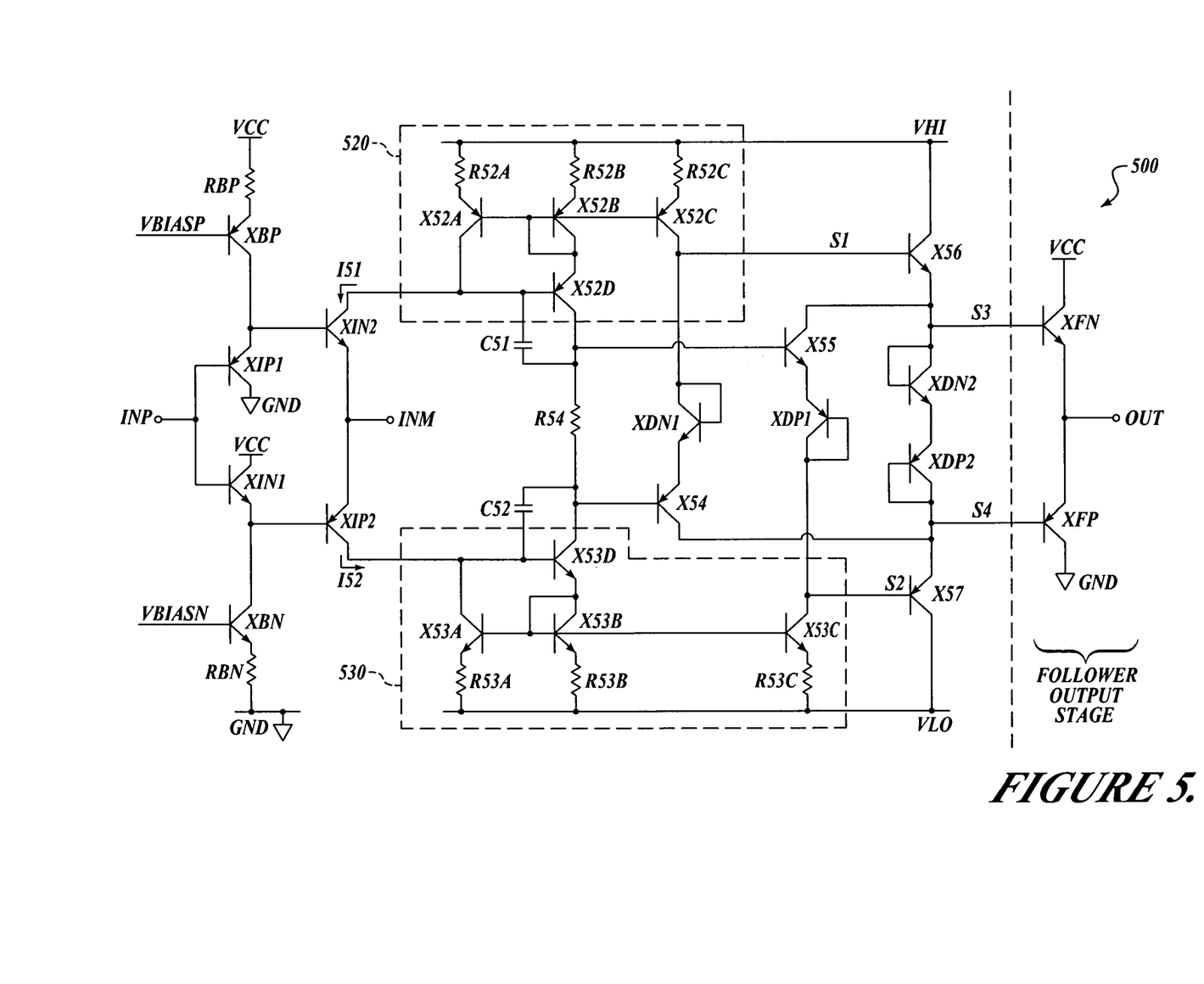
FIG. 5 is a schematic diagram of an amplifier circuit that is arranged in accordance with the present invention.

FIG. 5 is a schematic diagram of an amplifier circuit (500) that is arranged in accordance with the present invention. Amplifier circuit 500 includes nine resistors (RBP, RBN, R52A-R52C, R53A-R53C, R54), two capacitors (C51, C52), and twenty-four transistors (XBP, XBN, XIN1, XIN2, XIP1, XIP2, X52A-X52D, X53A-X53D, XDN1-XDN2, X54-X57, XDP1-XDP2, XFN, XFP).

Transistor XBP and resistor RBP are arranged to operate as a first current source that is biased by BIASP. Transistor XBN and resistor RBN are arranged to operate as a second current source that is biased by BIASN. Transistors XIN1 and XIP1 are configured to cooperate with the first and second current source to operate as input followers in the amplifier circuit that operate from the VCC and GND supply rails. Transistors XIN2 and XIP2 cooperate with the input followers to provide current signals I51 and I52, which are responsive to INP and INM.

Transistors X52A-X52D and resistors R52A-R52C are configured to operate as a first current mirror circuit (i.e., a Wilson-type current mirror circuit) that operates from the VHI supply rail. Transistors X53A-X53D and resistors R53A-R53C are configured to operate as a second current mirror circuit (i.e., a Wilson-type current mirror circuit) that operates from the VLO supply rail. The current mirror circuits receive current signals I51 and I52 via transistors X52A and X53A, respectively. The output of the current mirror circuits are combined through resistor R54, which is series connected between the outputs of transistors X52D and X53D. Capacitors C51 and C52 are coupled between the input of the current mirror circuits and their respective outputs to frequency-compensate the amplifier.

The amplifier includes a triple emitter follower class AB output stage. Transistors X54 is biased by current from transistor X52C in the first current mirror circuit such that transistor X54 operates as a first emitter follower circuit for the high drive side of the amplifier. Transistor XDN1 is a diode-connected transistor that is in series with transistor X54 for class AB operation. The high drive output of the first emitter follower circuit is provided as intermediate high drive signal S1. Transistors X55 is biased by current from transistor X53C in the second current mirror circuit such that transistor X55 operates as a first emitter follower circuit for the low drive side of the amplifier. Transistor XDP1 is a diode-connected transistor that is in series with transistor X55 for class AB operation. The low drive output of the first emitter follower circuit is provided as intermediate low drive signal S2. Resistor R54 helps reduce the operating current in the class AB output stage.

Transistor X56 is arranged to provide high drive signal S3 in response to intermediate drive signal S1, where transistor X56 is part of a second emitter follower for the high drive side of the output stage. Transistor X57 is arranged to provide low drive signal S4 in response to intermediate drive signal S2, where transistor X57 is part of the second emitter follower for the low drive side of the output stage. Transistors XDN2 and XDP2 are diode-connected devices that are arranged to provide class AB operation for the output stage. The class AB signals are provided to the third emitter follower, which corresponds to transistors XFN and XFP.

Amplifier circuit 500 includes all of the functionality that was described with respect to circuit 220. The first and second emitter follower circuits are operated from the VHI and VLO supply rails, similar to the pre-driver circuit (drivers DP and DN) that are described in FIG. 2. The collectors of transistors XFN and XFP are coupled to VCC and GND, similar to follower output stage 210. Since the third emitter follower provides the output signal to the load (see FIG. 2), the current that is delivered to the load is provided from the VCC and GND supplies. VHI and VLO are local power supplies that are used in the amplifier to generate signals S3 and S4.

For maximum power efficiency, the output swing should be within a VCE(SAT) of each supply rail (VCC and GND). The base voltage of transistor XFN should swing to VCC−VCE(SAT)+VBE (e.g., 12V −0.3V+0.8V=12.6V). Taking into account the VBE of X56, and the voltage drop from X52C and R52C, it can be shown that VHI must be larger than VCC+2VBE+ΔV=VCC+1.7V, which corresponds to approximately 13.7V for a VCC of 12V.

Similarly, the VLO supply must account for the headroom requirements of transistor XFP for maximum power efficiency. VLO should be lower than VCC by an amount that allows the PNP emitter-followers to swing within a VCE(SAT) of GND. It can be shown that VLO must be less than GND−2VBE−ΔV, which roughly corresponds to −1.7V for a GND voltage of 0V.

The power-supply requirements for VLO and VHI are determined by the current requirements for the class AB stage in the amplifier. Although the pre-driver circuit in the amplifier is operated from VHI and VLO, the final follower output stage in the amplifier is operated from VCC and GND (or VEE when GND is non-zero). Since the final output stage is not operated from the charge-pump supply, the sizes associated with the charge-pump local power-supply capacitors (e.g., C2 and C4 in FIG. 2) are somewhat independent of the load current (except for the base current in a bipolar design).

The drive levels for proper operation of the output stage are determined by the power supply levels and the saturation requirements of the transistors. The output stage illustrated in FIG. 5 includes a BJT output stage as represented by XFN and XFP. The high drive signal to XFP must swing to (VCC−VCE1(SAT)+VBE1), where VCE1(SAT) and VBE1 correspond to saturation and base-emitter voltages that are associated with the XFP. Similarly, the low drive signal to XFN must swing to (VEE−VCE2(SAT)+VBE2), where VCE2(SAT) and VBE2 correspond to saturation and base-emitter voltages that are associated with the XFN.

The drive level requirements of the output stage are slightly different for a FET based implementation (see FIG. 2). For example, the high drive signal must swing to (VCC−VDS1 (SAT)+VT 1+VOD1), where VOD1 is the minimum overdrive required by the high driver for saturation. Similarly, the low drive signal must swing to (VEE−

VDS2(SAT)+VT2+VOD2), where VOD2 is the minimum overdrive required by the low driver for saturation.

Although amplifier system 500 is illustrated as a bipolar transistor design, the same type of design may be employed in a FET type of implementation. For a FET implementation, the only current required by the gates of the follower output stage (e.g., see NF and PF in FIG. 2) are transient currents that are required to charge and discharge the gates of the FET devices. Thus, for a FET amplifier implementation the capacitors that are required by the charge-pump may be integrated on-chip. Moreover, by isolating the follower output stage current from the amplifier current, the overall power consumption in the amplifier is reduced when compared to other designs such as open collector or open drain outputs.

The above specification, examples and data provide a complete description of the manufacture and use of the composition of the invention. Since many embodiments of the invention can be made without departing from the spirit and scope of the invention, the invention resides in the claims hereinafter appended.

I claim:

1. An apparatus that is arranged to drive a load in response to a differential input signal, comprising:

a charge-pump circuit that is arranged to generate first and second local power-supply rails carrying a first local power-supply voltage and a second local power-supply voltage, respectively;

a pre-driver circuit that is arranged for operation from the first and second local power-supply rails and is configured to provide linear drive signals in response to the differential input signal such that a first one of the linear drive signals ranges to a first voltage that is substantially equivalent to the first local power-supply voltage and a second one of the linear drive signals ranges to a second voltage that is substantially equivalent to the second local power-supply voltage; and a non-inverting linear follower output stage circuit that is arranged for operation from third and fourth power-supply rails carrying a third local power-supply voltage and a fourth local power-supply voltage, respectively, wherein at least one of the third and the fourth local power-supply voltages is distinct from the first and the second local power-supply voltages, the non-inverting linear follower output stage circuit is further arranged to drive the load in response to the linear drive signals such that current is delivered to the load from at least one of the third and fourth power-supply rails, wherein the pre-driver circuit is configured to linearly drive the non-inverting linear follower output stage circuit such that a substantially rail-to-rail signal swing with respect to the third and fourth power-supply rails is achieved at the load with reduced signal distortion, and the non-inverting linear follower output stage circuit comprises:

a first transistor circuit that is arranged to control a current flow between the third power-supply rail and the load in response to the first one of the linear drive signals; and a second transistor circuit that is arranged to control a current flow between the fourth power-supply rail and the load in response to the second one of the linear drive signals;

wherein the charge-pump circuit comprises:

a first inverter circuit that is operated from VDD and GND, wherein the first inverter circuit has a first input that is configured to receive a clock signal, and a first output that is coupled to a first node;

a second inverter circuit that is operated from VDD and GND, wherein the second inverter circuit has a second input that is coupled to the first node, and a second output that is coupled to a second node;

a third inverter circuit that is operated from VHI and VCC, wherein the third inverter circuit has a third input that is coupled to a third node, and a third output that is coupled to a fourth node;

a fourth inverter circuit that is operated from VHI and VCC, wherein the fourth inverter circuit has a fourth input that is coupled to the fourth node, and a fourth output that is coupled to the third node;

a fifth inverter circuit that is operated from GND and VLO, wherein the fifth inverter circuit has a fifth input that is coupled to a fifth node, and a fifth output that is coupled to a sixth node;

a sixth inverter circuit that is operated from GND and VLO, wherein the sixth inverter circuit has a sixth input that is coupled to the sixth node, and a sixth output that is coupled to the fifth node;

a first capacitor that is coupled between the first and third nodes;

a second capacitor that is coupled between VHI and VCC;

a third capacitor that is coupled between the first and fifth nodes;

a fourth capacitor that is coupled between VLO and GND;

a fifth capacitor that is coupled between the fourth and second nodes; and a sixth capacitor that is coupled between the second and sixth nodes.

2. The apparatus of claim 1, wherein the first transistor circuit and the second transistor circuit comprise a first field effect transistor and a second field effect transistor, respectively, such that:

the first field effect transistor includes a first gate that is configured to receive the first one of the linear drive signals, a first drain that is coupled to the third power-supply rail, and a first source that is coupled to the load; and the second field effect transistor includes a second gate that is configured to receive the second one of the linear drive signals, a second drain that is coupled to the fourth power-supply rail, and a second source that is coupled to the load.

3. The apparatus of claim 1, wherein the first transistor circuit and the second transistor circuit comprise a first bipolar junction transistor and a second bipolar junction transistor, respectively, such that:

the first bipolar junction transistor includes a first base that is configured to receive the first one of the linear drive signals, a first collector that is coupled to the third power-supply rail, and a first emitter that is coupled to the load; and the second bipolar junction transistor includes a second base that is configured to receive the second one of the linear drive signals, a second collector that is coupled to the fourth power-supply rail, and a second emitter that is coupled to the load.

4. The apparatus of claim 1, wherein the pre-driver circuit further comprises:

a first linear drive circuit that is arranged to provide a first one of the linear drive signals, wherein the first linear drive circuit is configured as a high level-shift driver that is operated from the first local power-supply rail; and a second linear drive circuit that is arranged to provide a second one of the linear drive signals, wherein the second drive circuit is configured as a low level-shift driver that is operated from the second local power-supply rail.

5. The apparatus of claim 1, wherein the pre-driver circuit further comprises:
a first emitter follower circuit that is arranged to provide a first one of the linear drive signals, wherein the first emitter follower circuit is configured as a high level-shift driver that is operated from the first local power-supply rail; and
a second emitter follower circuit that is arranged to provide a second one of the linear drive signals, wherein the second emitter follower circuit is configured as a low level-shift driver that is operated from the second local power-supply rail.

6. The apparatus of claim 1, wherein the pre-driver circuit further comprises:
a first source follower circuit that is arranged to provide a first one of the linear drive signals, wherein the first source follower circuit is configured as a high level-shift driver that is operated from the first local power-supply rail; and
a second source follower circuit that is arranged to provide a second one of the linear drive signals, wherein the second source follower circuit is configured as a low level-shift driver that is operated from the second local power-supply rail.

7. An apparatus that is arranged to drive a load in response to a differential input signal, comprising:
a linear amplifier circuit that includes:
a pre-driver circuit that is operated from local power supplies VHI and VLO and is configured to provide linear drive signals such that a first one of the linear drive signals ranges to a first voltage that is substantially equivalent to VHI and a second one of the linear drive signals ranges to a second voltage that is substantially equivalent to VLO;
a non-inverting linear follower output stage circuit, wherein the non-inverting linear follower output stage is arranged to drive the load from power supplies VCC and VEE, at least one of VCC and VEE is distinct from VHI and VLO, wherein the pre-driver circuit is configured to linearly drive the non-inverting linear follower output stage circuit such that a substantially rail-to-rail signal swing with respect to the third and fourth power-supply rails is achieved at the load with reduced signal distortion, and the non-inverting linear follower output stage circuit comprises:
a first transistor circuit that includes a first control terminal, and is arranged to control a signal flow between the power supply VCC and the load in response to the first one of the linear drive signals, wherein the first one of the linear drive signals is provided to the first control terminal; and
a second transistor circuit that includes a second control terminal, and is arranged to control a signal flow between the power supply VEE and the load in response to the second one of the linear drive signals, wherein the second one of the linear drive signals is provided to the second control terminal; and
a charge-pump circuit that is arranged to generate local power-supplies VHI and VLO, wherein VHI is greater than VCC and VLO is less than VEE;

wherein the pre-driver circuit comprises:
an input follower circuit that is operated from VCC and VEE, wherein the input follower is configured to provide current signals I51 and I52 responsive to the differential input signal;
a first current mirror circuit that is operated from VHI, wherein the first current mirror circuit is configured to receive current signal I51;
a second current mirror circuit that is operated from VLO, wherein the second current mirror circuit is configured to receive current signal I52; and
a resistor that is coupled between outputs of the first and second current mirror circuits, wherein the input follower circuit, the first current mirror circuit, the second current mirror circuit, and the resistor are arranged in cooperation such that the pre-driver circuit provides the linear drive signals responsive to the differential input signal.

8. The apparatus of claim 7, wherein the charge-pump circuit further comprises:
a high charge-pump circuit that is arranged to generate the first local power-supply rail; and
a low charge-pump circuit that is arranged to generate the second local power-supply rail.

9. The apparatus of claim 8, wherein the high charge-pump circuit further comprises:
a first capacitor that is arranged to store a charge during a charging phase;
a second capacitor that is coupled to the third power-supply rail, and arranged to provide a voltage that is associated with the first local power-supply rail; and
a switching circuit that is configured to transfer the stored charge from the first capacitor to the second capacitor during a charge redistribution phase such that the voltage associated with the first local power-supply rail is greater than the voltage associated with the third power-supply rail.

10. The apparatus of claim 8, wherein the low charge-pump circuit further comprises:
a third capacitor that is arranged to store a charge during a charging phase;
a fourth capacitor that is coupled to the fourth power-supply rail, and arranged to provide a voltage that is associated with the second local power-supply rail; and
a switching circuit that is configured to transfer the stored charge from the third capacitor to the fourth capacitor during a charge redistribution phase such that the voltage associated with the second local power-supply rail is less than the voltage associated with the fourth power-supply rail.

11. The apparatus of claim 7, wherein the charge-pump circuit further comprises:
a first inverter circuit that is operated from VDD and GND, wherein the first inverter circuit has a first input that is configured to receive a clock signal, and a first output that is coupled to a first node;
a second inverter circuit that is operated from VDD and GND, wherein the second inverter circuit has a second input that is coupled to the first node, and a second output that is coupled to a second node;
a third inverter circuit that is operated from VHI and VCC, wherein the third inverter circuit has a third input that is coupled to a third node, and a third output that is coupled to a fourth node;
a fourth inverter circuit that is operated from VHI and VCC, wherein the fourth inverter circuit has a fourth input that is coupled to the fourth node, and a fourth output that is coupled to the third node;

a fifth inverter circuit that is operated from GND and VLO, wherein the fifth inverter circuit has a fifth input that is coupled to a fifth node, and a fifth output that is coupled to a sixth node;

a sixth inverter circuit that is operated from GND and VLO, wherein the sixth inverter circuit has a sixth input that is coupled to the sixth node, and a sixth output that is coupled to the fifth node;

a first capacitor that is coupled between the first and third nodes;

a second capacitor that is coupled between VHI and VCC;

a third capacitor that is coupled between the first and fifth nodes;

a fourth capacitor that is coupled between VLO and GND;

a fifth capacitor that is coupled between the fourth and second nodes; and a sixth capacitor that is coupled between the second and sixth nodes.

12. The apparatus of claim 7, wherein the charge-pump circuit is arranged to generate local power-supply VHI as given by:

$$VHI=VCC+VDD-\text{delta } V,$$

wherein VDD is a power-supply voltage for the charge-pump circuit, and delta V is a small error that is related to switch resistance and parasitic capacitance.

13. The apparatus of claim 7, wherein the charge-pump circuit is arranged to generate local power-supply VLO as given by:

$$VLO=VEE-VDD+\text{delta } V,$$

wherein VDD is a power-supply voltage for the charge-pump circuit, and delta V is a small error that is related to switch resistance and parasitic capacitance.

14. The apparatus of claim 7, wherein the linear amplifier circuit is further arranged such that one of the linear drive signals swings to (VCC−VCE1 (SAT)+VBE1), and another of the linear drive signals swings to (VEE−VCE2(SAT)+VBE2), wherein VCE1(SAT), VCE2(SAT), VBE1, and VBE2 correspond to saturation and base-emitter voltages that are associated with the non-inverting linear follower output stage circuit.

15. The apparatus of claim 7, wherein the linear amplifier circuit is further arranged such that one of the linear drive signals swings to (VCC−VDS1(SAT)+VT1+VOD1), and another of the linear drive signals swings to (VEE−VDS2(SAT)+VT2+VOD2), wherein VDS1(SAT), VDS2(SAT), VT1, and VT2 correspond to saturation and threshold voltages that are associated with the follower output stage circuit, and wherein VOD1 and VOD2 correspond to gate overdrive voltages.

16. The apparatus of claim 14, the linear amplifier circuit further comprising:

a first emitter follower circuit that is responsive to signals from the outputs of the current mirror circuits, and configured to provide an intermediate high drive signal (S1) for a high drive side of the linear amplifier circuit, and also configured to provide an intermediate low drive signal (S2) for a low drive side of the linear amplifier circuit; and a second emitter follower circuit that is responsive to the intermediate high and low drive signals (S1, S2), and configured to provide a high drive signal (S3) for a high drive side of the linear amplifier circuit, and also configured to provide a low drive signal (S2) for a low drive side of the linear amplifier circuit, wherein the non-inverting linear follower output stage circuit is responsive to the high and low drive signals (S3, S4).

17. An apparatus that is arranged to drive a load in response to a differential input signal, comprising:

a means for generating that is configured to generate first and second local power-supply rails carrying a first local power-supply voltage and a second local power-supply voltage, respectively;

a means for pre-driving that is configured to operate from the first and second local power-supply rails and is configured to provide linear drive signals such that a first one of the linear drive signals ranges to a first voltage that is substantially equivalent to the first local power-supply voltage and a second one of the linear drive signals ranges to a second voltage that is substantially equivalent to the second local power-supply voltage; and a non-inverting linear follower means that is arranged for operation from third and fourth power-supply rails carrying a third power-supply voltage and a fourth power-supply voltage, respectively, wherein at least one of the third and the fourth power-supply voltages is distinct from the first and the second local power-supply voltages, the non-inverting linear follower means is arranged to drive the load in response to the linear drive signals such that current is delivered to the load from at least one of the third and fourth power-supply rails, wherein the means for pre-driving is configured to linearly drive the non-inverting linear follower means such that a substantially rail-to-rail signal swing with respect to the third and fourth power-supply rails is achieved at the load with reduced signal distortion, and the follower means comprises:

a first driving means that is arranged to control a current flow between the third power-supply rail and the load in response to the first one of the linear drive signals such that an amount of current provided to the load is adjusted according to the first one of the linear drive signals; and a second driving means that is arranged to control a current flow between the fourth power-supply rail and the load in response to the second one of the linear drive signals such that an amount of current provided to the load is adjusted according to the second one of the linear drive signals;

wherein the means for pre-driving comprises:

a first input follower means that is operated from the third and fourth power-supply rails and arranged to generate a first current signal responsive to the differential input signal;

a second input follower means that is operated from the third and fourth power-supply rails and arranged to generate a second current signal responsive to the differential input signal;

a first current mirror means that is operated from first local power-supply rail, wherein the first current mirror means is configured to receive the first current signal;

a second current mirror means that is operated from the second local power-supply rail, wherein the second current mirror means is configured to receive the second current signal; and a resistor means that is coupled between a first output of the first current mirror means and a first output of the second current mirror means, wherein the first input follower means, the second input follower means, the first current mirror means, the second current mirror means, and the resistor means are arranged in cooperation such that the means for pre-driving provides the linear drive signals responsive to the differential input signal.

18. The apparatus of claim 17, wherein the means for generating further comprises:
    a first capacitive means that is arranged to store a charge during a charging phase;
    a second capacitive means that is coupled to the third power-supply rail, and arranged to provide a voltage that is associated with the first local power-supply rail; and
    a switching means that is configured to transfer the stored charge from the first capacitive means to the second capacitive means during a charge redistribution phase such that the voltage associated with the first local power-supply rail is greater than the voltage associated with the third power-supply rail.

19. The apparatus of claim 17, wherein the means for generating further comprises:
    a third capacitive means that is arranged to store a charge during a charging phase;
    a fourth capacitive means that is coupled to the fourth power-supply rail, and arranged to provide a voltage that is associated with the second local power-supply rail; and
    a switching means that is configured to transfer the stored charge from the third capacitive means to the fourth capacitive means during a charge redistribution phase such that the voltage associated with the second local power-supply rail is less than the voltage associated with the fourth power-supply rail.

20. The apparatus of claim 17, wherein the means for pre-driving further comprises:
    a first follower means that is biased by the a second output of the first current-mirror means and responsive to a first signal from the resistor means to provide the first one of the linear drive signals, wherein the first signal from the resistor means is associated with the first output of the second current-mirror means; and
    a second follower means that is biased by the a second output of the second current-mirror means and responsive to a second signal from the resistor means to provide the second one of the linear drive signals, wherein the second signal from the resistor means is associated with the first output of the first current-mirror means.

21. An apparatus that is arranged to drive a load in response to a differential input signal, comprising:
    an amplifier circuit that includes:
        a pre-driver circuit that is operated from local power supplies VHI and VLO and is configured to provide drive signals in response to the differential input signal such that a first one of the drive signals ranges to a first voltage that is substantially equivalent to VHI and a second one of the drive signals ranges to a second voltage that is substantially equivalent to VLO;
        a follower output stage, wherein the follower output stage is arranged to drive the load from power supplies VCC and VEE that are distinct from VHI and VLO, and wherein the follower output stage comprises:
            a first transistor circuit that includes a first control terminal, and is arranged to control a signal flow between the power supply VCC and the load in response to the first one of the drive signals, wherein the first one of the drive signals is provided to the first control terminal; and
            a second transistor circuit that includes a second control terminal, and is arranged to control a signal flow between the power supply VEE and the load in response to the second one of the drive signals, wherein the second one of the drive signals is provided to the second control terminal; and
    a charge-pump circuit that is arranged to generate local power-supplies VHI and VLO, wherein VHI is greater than VCC and VLO is less than VEE;
    wherein the pre-driver circuit comprises:
        an input follower circuit that is operated from VCC and VEE, wherein the input follower is configured to provide current signals I51 and I52 in response to the differential input signal;
        a first current mirror circuit that is operated from VHI, wherein the first current mirror circuit is configured to receive current signal I51;
        a second current mirror circuit that is operated from VLO, wherein the second current mirror circuit is configured to receive current signal I52;
        a resistor that is coupled between outputs of the first and second current mirror circuits;
        a first emitter follower circuit that is responsive to signals from the outputs of the current mirror circuits, and configured to provide an intermediate high drive signal (S1) for a high drive side of the amplifier circuit, and also configured to provide an intermediate low drive signal (S2) for a low drive side of the amplifier circuit; and
        a second emitter follower circuit that is responsive to the intermediate high and low drive signals (S1, S2), and configured to provide a high drive signal (S3) for a high drive side of the amplifier circuit, and also configured to provide a low drive signal (S2) for a low drive side of the amplifier circuit, wherein the follower output stage is responsive to the high and low drive signals (S3, S4).

* * * * *